(12) United States Patent
Ahn

(10) Patent No.: US 8,120,964 B2
(45) Date of Patent: Feb. 21, 2012

(54) NONVOLATILE MEMORY DEVICE AND METHOD OF OPERATING THE SAME

(75) Inventor: Sung Hoon Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 85 days.

(21) Appl. No.: 12/651,054

(22) Filed: Dec. 31, 2009

(65) Prior Publication Data

US 2010/0214848 A1 Aug. 26, 2010

(30) Foreign Application Priority Data

Feb. 26, 2009 (KR) .................. 10-2009-0016320

(51) Int. Cl.
*G11C 16/06* (2006.01)
(52) U.S. Cl. ................................. 365/185.21
(58) Field of Classification Search ............. 365/185.21
See application file for complete search history.

(56) References Cited

U.S. PATENT DOCUMENTS

| 7,023,736 | B2 | 4/2006 | Cernea et al. |
| 7,916,547 | B2* | 3/2011 | Hosono ............... 365/185.21 |
| 2006/0140007 | A1* | 6/2006 | Cernea et al. ........... 365/185.21 |
| 2008/0013382 | A1* | 1/2008 | Tang ...................... 365/185.24 |
| 2009/0290431 | A1* | 11/2009 | Park et al. .............. 365/185.25 |
| 2010/0182843 | A1* | 7/2010 | Tang ...................... 365/185.21 |

FOREIGN PATENT DOCUMENTS

KR 1020090000411 1/2009

OTHER PUBLICATIONS

Notice of Allowance issued from Korean Intellectual Property Office on Nov. 30, 2010.

* cited by examiner

*Primary Examiner* — Hoai V Ho
*Assistant Examiner* — Min Huang
(74) *Attorney, Agent, or Firm* — IP & T Group LLP

(57) ABSTRACT

A nonvolatile memory device includes a first node, a current source configured to have a current value determined according to a voltage supplied to the first node, and a memory cell string coupled to the first node, the memory cell string including at least one memory cell. Whether a memory cell included in the memory cell string has been programmed is determined based on the voltage supplied to the first node.

8 Claims, 7 Drawing Sheets

NONVOLATILE MEMORY DEVICE AND METHOD OF OPERATING THE SAME

CROSS-REFERENCE TO RELATED APPLICATIONS

Priority to Korean patent application number 10-2009-0016320 filed on Feb. 26, 2009, the entire disclosure of which is incorporated by reference herein, is claimed.

BACKGROUND

An embodiment of the present invention relates to a nonvolatile memory device and a method of operating the same.

In recent years, there has been an increasing demand for nonvolatile memory devices which can be electrically programmed and erased and which do not require the refresh function of rewriting data at specific time intervals.

The nonvolatile memory cell of the nonvolatile memory device can be electrically programmed and erased. The program and erase operations are performed using the threshold voltage of the cell which varies when electrons are moved by a strong electric field applied to the thin oxide layer of the cell.

The nonvolatile memory device includes a memory cell array in which memory cells for storing data are arranged in a matrix form and page buffers each for writing data into specific memory cells of the memory cell array or for reading data stored in specific memory cells. The page buffer includes a pair of bit lines coupled to specific memory cells, a register configured to temporarily store data to be written into a specific memory cell or to temporarily store data read from a specific memory cell, a sense node configured to sense the voltage level of a specific bit line or a specific register, and a bit line selection unit configured to control whether or not to couple the specific bit line to the sensing node.

In conventional program and verification operations of such a nonvolatile memory device, the program operation is sequentially performed on even pages and odd pages, and the verification operation is also performed. Thus, the effect of coupling noise between the bit lines of the even and odd pages on the sense operation can be minimized/reduced. However, with a reduction in the size of a cell, it becomes difficult to reduce such coupling noise between the bit lines using this method. Accordingly, there is a need for a sense method capable of minimizing/reducing coupling noise between the bit lines.

SUMMARY OF THE INVENTION

An embodiment of the present invention relates to a nonvolatile memory device and a method of operating the same, which are capable of improving a verification operation.

A nonvolatile memory device according to an embodiment of the present invention includes a first node, a current source configured to have a current value determined according to a voltage of the first node, and a memory cell string coupled to the first node, the memory cell string including at least one memory cell. Whether a memory cell included in the memory cell string has been programmed is determined based on the voltage of the first node.

A nonvolatile memory device according to another embodiment of the present invention includes a plurality of data latch units, a memory cell string including at least one memory cell, a current supply unit configured to supply a current to the memory cell string, a bit line switch unit configured to selectively couple the memory cell string to the current supply unit, first and second sense nodes, and a bit line sense unit configured to selectively couple the first sense node to which the bit line switch unit and the current supply unit have been coupled to the second sense node to which the data latch units have been coupled. Whether a memory cell included in the memory cell string has been programmed is determined based on a voltage of the first sense node.

A method of operating a nonvolatile memory device according to yet another embodiment of the present invention includes providing the nonvolatile memory device including a memory cell string and a current supply unit selectively coupled to the memory cell string, discharging a bit line to a low level, supplying a reference voltage to a word line coupled to a target read cell and a pass voltage to word lines coupled to the remaining cells, coupling the current supply unit, the bit line, and the memory cell string together, changing an amount of current, supplied by the current supply unit and flowing through the memory cell string, according to whether a threshold voltage of the target read cell is larger than the reference voltage, determining a voltage supplied to a node between the current supply unit and the memory cell string, according to the amount of current supplied by the current supply unit, and sensing the voltage of the node and storing the sensed voltage in a latch unit.

A method of operating a nonvolatile memory device according to further yet another embodiment of the present invention includes providing the nonvolatile memory device including a plurality of page buffers, each buffer including first and second latch units, a memory cell string, and a current supply unit selectively coupled to the memory cell string according to data stored in the first latch unit, discharging a bit line to a low level, supplying a reference voltage to a word line coupled to a target read cell of the memory cell and supplying a pass voltage to word lines coupled to the remaining cells of the memory cell string, coupling the current supply unit, the bit line, and the memory cell string together, changing an amount of current, supplied by the current supply unit and flowing through the memory cell string, according to whether a threshold voltage of the target read cell is larger than the reference voltage, supplying a bit line sense signal of a first voltage and storing information about cells having an amount of current larger than the reference current in the first latch unit, the current supply unit selectively supplying the current according to the data stored in the first latch unit, changing an amount of current, supplied by the current supply unit and flowing through the memory cell string, according to whether a threshold voltage of the target read cell is larger than the reference voltage, and supplying the bit line sense signal of a second voltage and storing information about a threshold voltage of each cell, based on the amount of current, in the second latch unit.

DESCRIPTION OF THE INVENTION

Figure 1:
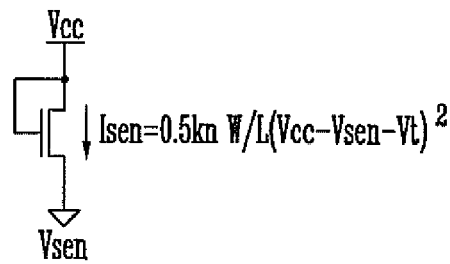
FIG. 1 is a circuit diagram of a voltage-dependent current source applicable to an embodiment of the present invention.
Figure 1:
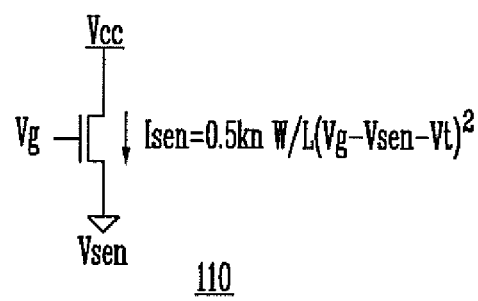

Hereinafter, embodiments of the present invention are described in detail with reference to the accompanying drawings. The drawing figures are provided to allow those having ordinary skill in the art to understand the scope of the embodiments of the present invention.

FIG. 1 is a circuit diagram of a voltage-dependent current source applicable to an embodiment of the present invention.

In FIG. 1, a first voltage-dependent current source 100 includes a diode-coupled NMOS transistor configured to have one terminal coupled to a power source voltage VCC. A current Isen flowing through the NMOS transistor is determined by the power source voltage VCC, a voltage Vsen supplied to the other terminal of the NMOS transistor, and a threshold voltage Vt.

That is, $Isen=0.5\ Kn'W/L(VCC-Vsen-Vt)^2$

A second voltage-dependent current source 110 includes an NMOS transistor having one terminal coupled to a power source voltage VCC and a gate supplied with a specific voltage Vg. A current Isen flowing through the NMOS transistor is determined by the power source voltage VCC, the voltage Vg, and a threshold voltage Vt.

That is, $Isen=0.5\ Kn'W/L(Vg-Vsen-Vt)^2$

In the above equations, assuming that the voltage Vsen supplied to the other terminal of the NMOS transistor is a parameter, it can be said that the current flowing through the transistor is determined by the voltage Vsen supplied to the other terminal of the transistor.

Figure 2:
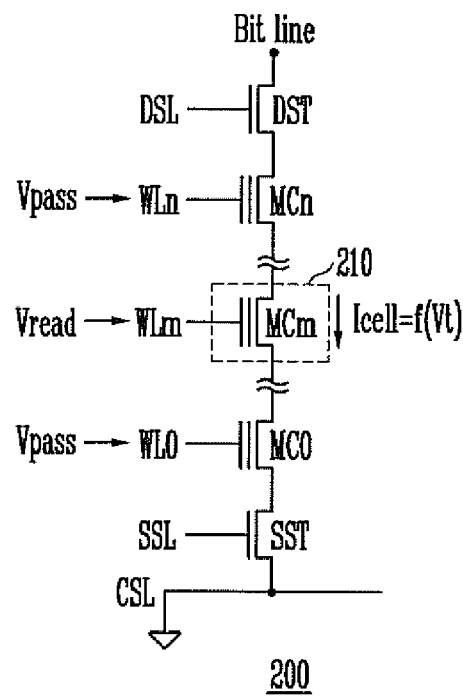
FIG. 2 is a diagram showing a memory cell string included a nonvolatile memory device applicable to an embodiment of the present invention.

FIG. 2 is a diagram showing a memory cell string included a nonvolatile memory device applicable to an embodiment of the present invention.

The memory cell string 200 includes a plurality of memory cells MC0 to MCn coupled in series, a drain select transistor DST configured to selectively couple a bit line and the memory cell MCn, and a source select transistor SST configured to selectively couple the memory cell MC0 and a common source line CSL. A method of performing a verification operation or a read operation is described below.

In the verification operation or the read operation, a cell 210 is first selected, and a determination is then made as to whether the threshold voltage of the selected cell 210 is larger than a reference voltage Vread. To this end, the bit line is precharged to a high level. Next, the reference voltage Vread is supplied to a word line WLm coupled to the selected cell 210, and a pass voltage Vpass is supplied to word lines coupled to the remaining unselected cells. Accordingly, the unselected cells are turned on irrespective of the threshold voltage of the selected cell, and whether the selected cell will be turned on is determined according to its threshold voltage. That is, if the threshold voltage of the selected cell is larger than the reference voltage, the selected cell is not turned on, and if the threshold voltage of the selected cell is less than the reference voltage, the selected cell is turned on.

If the selected cell 210 is turned on, then all of the cells coupled to the corresponding bit line are turned on, and so the bit line of a high level is discharged through the common source line CSL of a ground state. In other words, a current flowing through the cell string is increased. However, if the selected cell 210 is not turned on, a current path through the cell string is not formed, and so the bit line remains at the high level. That is, the value of the current flowing through the cell string is almost 0. As described above, a value of current flowing through a cell string is determined by the threshold voltage of a selected cell.

It can be said that a current Icell flowing through the cell string equals a function f(Vt) in which the threshold voltage of the selected cell is a dependent variable.

A case in which such a cell string is coupled to a voltage-dependent current source is taken into consideration below.

Figure 3A:
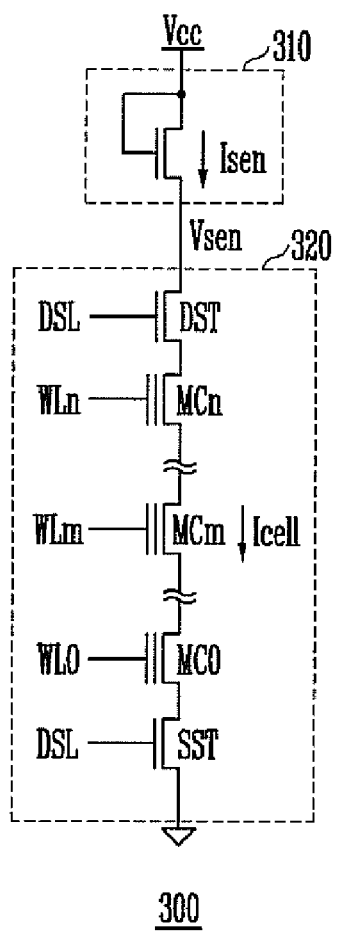
FIGS. 3A to 3C are diagrams illustrating the concept of a read method through coupling of a current source and the cell string of a nonvolatile memory device according to an embodiment of the present invention.
Figure 3B:
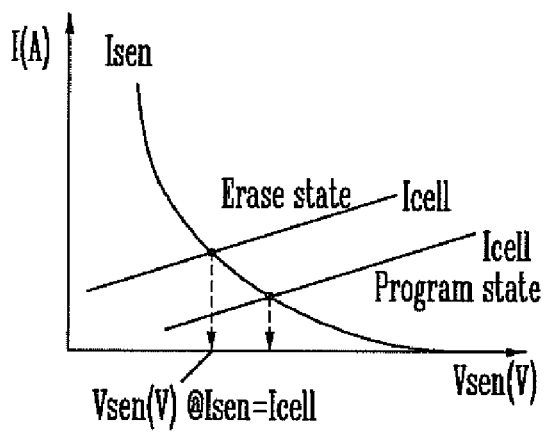
Figure 3C:
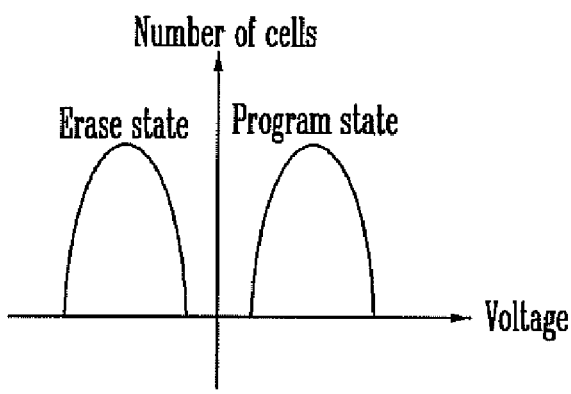

FIGS. 3A to 3C are diagrams illustrating the concept of a read method through coupling of a current source and the cell string of a nonvolatile memory device according to an embodiment of the present invention.

The nonvolatile memory device 300 includes the current source 310 and the cell string 320.

The current source 310 has the same construction as the current source 100 of FIG. 1, and it may be replaced by the current source 110.

The cell string 320 has the same construction as the cell string 200 of FIG. 2.

As described with reference to FIGS. 1 and 2, the current Isen supplied by the current source 310 is determined by the voltage Vsen supplied to one terminal of the transistor. The current Icell flowing through the cell string 320 is determined by the threshold voltage Vt of the memory cell. If the current source 310 and the cell string 320 are coupled together, the current Isen becomes identical to the current Icell at any moment. A current at this time is determined by the voltage Vsen or the threshold voltage Vt, and so it can be said that the two current values are equal. Accordingly, the threshold voltage Vt of the corresponding memory cell can be known by measuring the voltage Vsen supplied to a node between the cell string 320 and the current source 310.

A method of measuring the threshold voltage Vt according to the amount of the current Icell flowing through the cell string 320 is described below in more detail.

Referring to FIG. 3C, assuming that the reference voltage is 0 V, cells of a program state and an erase state can be distinguished from each other.

Referring to FIG. 3B, the current Isen flowing through the current source 310 is in inverse proportion to the voltage Vsen according to the above equations. Further, since the current Icell flowing through the cell string is increased with an increase in the voltage of the bit line, it is proportional to the voltage Vsen.

The value of the voltage Vsen at the node where the current Isen intersects the current Icell is the threshold voltage Vt of the selected cell. It can be seen that, if the selected cell is in an erase state, current flowing through the cell string rises, and the voltage Vsen is relatively reduced. Further, it can also be seen that, if the selected cell is in a program state, current flowing through the cell string is reduced, and the voltage Vsen also relatively rises.

Accordingly, it can be determined that, if the voltage Vsen is relatively high, the threshold voltage Vt of the selected cell is relatively high. That is, it can be seen that the voltage Vsen is increased in proportion to the threshold voltage Vt of a cell. Accordingly, the threshold voltage of the selected cell can be determined based on voltage supplied to the node of the current source 310 and the cell string 320.

Figure 4:
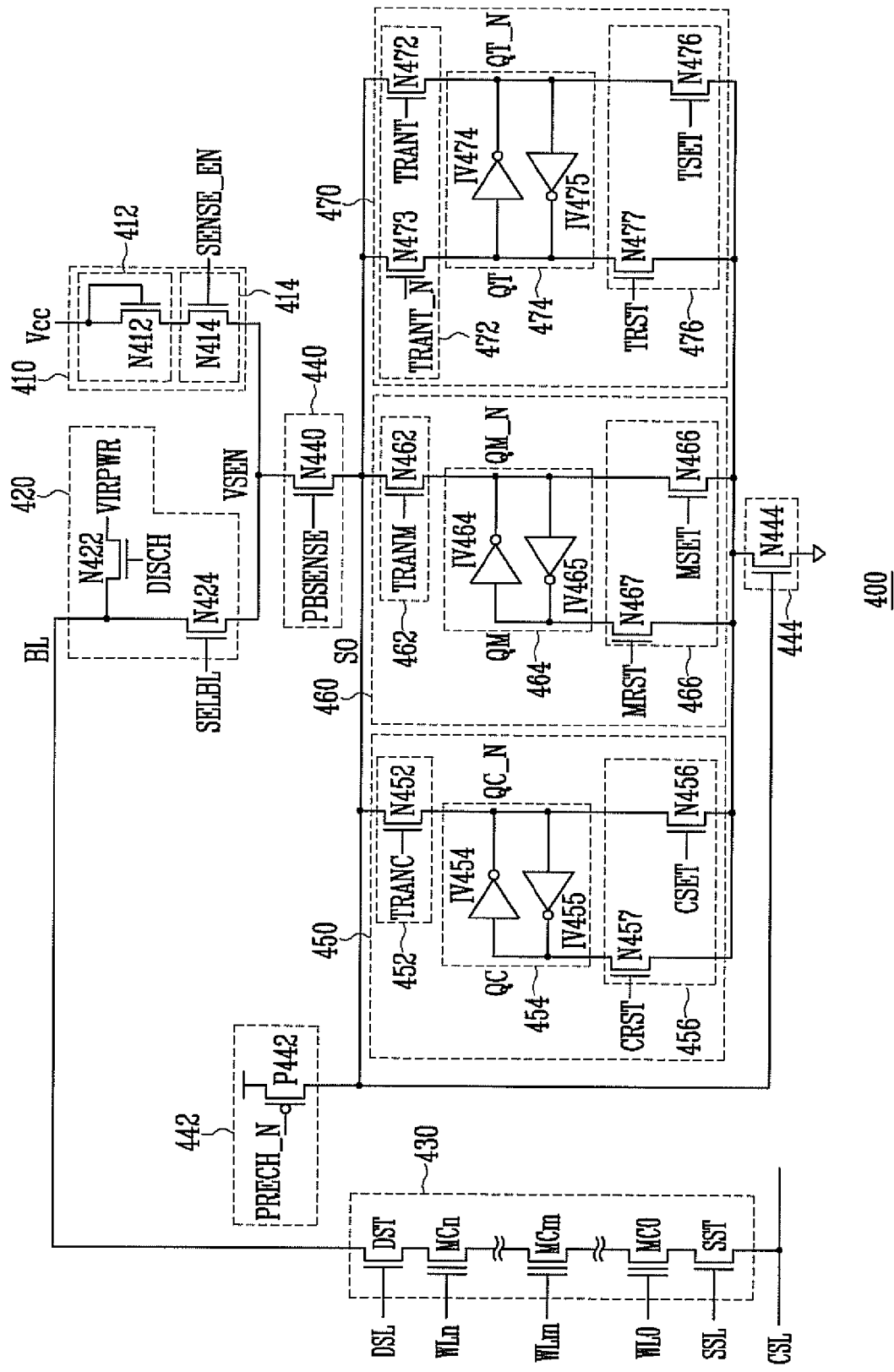
FIG. 4 is a circuit diagram of a nonvolatile memory device according to an embodiment of the present invention.

FIG. 4 is a circuit diagram of a nonvolatile memory device according to an embodiment of the present invention.

The nonvolatile memory device 400 includes a current supply unit 410, a bit line switch unit 420, a cell string 430, a bit line sense unit 440, a sense node precharge unit 442, a sense node sense unit 444, a first latch unit 450, a second latch unit 460, and a third latch unit 470. The remaining elements other than the cell string 430 function as one page buffer. The page buffer is coupled to each cell string.

The current supply unit 410 includes a current source 412 and a current transfer unit 414 configured to supply a first sense node VSEN with the current of the current source 412. The first sense node VSEN is formed at the node of the current supply unit 410 and the bit line switch unit 420.

The current source 412 includes a diode-coupled NMOS transistor N412 configured to have one terminal coupled to the terminal of a power source voltage Vcc. Accordingly, the current supplied by the current source 412 is determined by the power source voltage Vcc.

The current transfer unit 414 is configured to supply the cell string 430 with the current, supplied by the current source 412, via the first sense node VSEN in response to an enable signal SENSE_EN. To this end, the current transfer unit 414 includes an NMOS transistor N414 coupled between the current source 412 and the first sense node VSEN and configured to receive the enable signal SENSE_EN through its gate.

The bit line switch unit 420 is configured to precharge or discharge a bit line BL or to selectively couple the current supply unit 410 to the cell string 430. To this end, the bit line switch unit 420 includes a variable voltage input terminal configured to supply a variable voltage VIRPWR and an NMOS transistor N422 configured to couple the bit line BL to the variable voltage input terminal in response to a discharge signal DISCH. The bit line switch unit 420 further includes an NMOS transistor N424 configured to couple the bit line BL to the current supply unit 410 in response to a bit line selection signal SELBL.

Accordingly, the bit line BL can be precharged to a high level or a low level in response to the variable voltage VIRPWR and the discharge signal DISCH. Further, the bit line BL and the current supply unit 410 can be selectively coupled together.

The cell string 430 has the same construction as the cell strings 320 or 200.

The bit line sense unit 440 includes an NMOS transistor N440 turned on in response to a bit line sense signal PBSENSE and coupled to the first sense node VSEN and a second sense node SO. The second sense node SO is formed at the node of the latch units 450, 460, and 470. When the bit line sense signal PBSENSE is supplied, the voltage supplied to the first sense node VSEN becomes equal to the voltage supplied to the second sense node SO.

When verification and read operations are performed, a sense voltage can be supplied such that the state of a specific memory cell is transferred to the sense node.

The sense node precharge unit 442 is configured to supply the power source voltage Vcc of a high level to the first sense node VSEN or the second sense node SO in response to a precharge signal PRECH_N. To this end, the sense node precharge unit 442 includes a PMOS transistor P442 coupled between the power source voltage terminal Vcc and the second sense node SO. Accordingly, the power source voltage Vcc of a high level can be supplied to the second sense node SO in response to the precharge signal of a low level.

The sense node sense unit 444 is configured to supply a ground voltage to each of the latch units 450, 460, and 470 according to the voltage level of the second sense node SO. To this end, the sense node sense unit 444 includes an NMOS transistor N444 configured to have a gate coupled to the second sense node SO and coupled between the ground terminal and each of the latch units 450, 560, and 470. Accordingly, the ground voltage can be supplied to each of the latch units according to the voltage level of the second sense node SO.

The first latch unit 450 includes a latch 454 configured to store data, a data set unit 456, and a data transmission unit 452. The data set unit 456 is configured to transfer the ground voltage, received from the sense node sense unit 444, to the latch 454 in response to data set signals CRST or CSET. The data transmission unit 452 is configured to transfer data, stored in the first node QC_N of the latch 454, to the second sense node SO.

The latch 454 includes a first inverter IV454 and a second inverter IV455. The output terminal of the first inverter IV454 is coupled to the input terminal of the second inverter IV455, and the output terminal of the second inverter IV455 is coupled to the input terminal of the first inverter IV454. An intervening node between the output terminal of the first inverter IV454 and the input terminal of the second inverter IV455 is called the first node QC_N. An intervening node of the output terminal of the second inverter IV455 and the input terminal of the first inverter IV454 is called a second node QC. Accordingly, data of opposite levels are stored in the first node QC_N and the second node QC.

The data set unit 456 includes an NMOS transistor N456 and an NMOS transistor N457. The NMOS transistor N456 is configured to supply the first node QC_N with the ground voltage, received from the sense node sense unit 444, in response to the first data set signal CSET. The NMOS transistor N457 is configured to supply the second node QC with the ground voltage, received from the sense node sense unit 444, in response to the second data set signal CRST.

The data transmission unit 452 includes an NMOS transistor N452 configured to transfer data, stored in the first node QC_N of the latch 454, to the sense node SO in response to a data transmission signal TRANC. Accordingly, data stored in the first node QC_N can be transferred to the second sense node SO in response to the data transmission signal TRANC.

The second latch unit 460 includes a latch 464 configured to store data, a data set unit 466, and a data transmission unit 462. The data set unit 466 is configured to transfer the ground voltage, received from the sense node sense unit 444, to the latch 464 in response to data set signals MRST and MSET. The data transmission unit 462 is configured to transfer data, stored in the first node QM_N of the latch 464, to the second sense node SO.

The latch 464 includes a first inverter IV464 and a second inverter IV465. The output terminal of the first inverter IV464 is coupled to the input terminal of the second inverter IV465, and the output terminal of the second inverter IV465 is coupled to the input terminal of the first inverter IV464. An intervening node between the output terminal of the first inverter IV464 and the input terminal of the second inverter IV465 is called the first node QM_N. An intervening node between the output terminal of the second inverter IV465 and the input terminal of the first inverter IV464 is called a second node QM. Accordingly, data of opposite levels are stored in the first node QM_N and the second node QM.

The data set unit 466 includes an NMOS transistor N466 and an NMOS transistor N467. The NMOS transistor N466 is configured to supply the first node QM_N with the ground voltage, received from the sense node sense unit 444, in response to the first data set signal MSET. The NMOS transistor N467 is configured to supply the second node QM with the ground voltage, received from the sense node sense unit 444, in response to the second data set signal MRST.

The data transmission unit 462 includes an NMOS transistor N462 configured to transfer data, stored in the first node QM_N of the latch 464, to the sense node SO in response to a data transmission signal TRANM. Accordingly, data stored in the first node QM_N can be transferred to the second sense node SO in response to the data transmission signal TRANM.

The third latch unit 470 includes a latch 474 configured to store data, a data set unit 476, and a data transmission unit 472. The data set unit 476 is configured to transfer the ground voltage, received from the sense node sense unit 444, to the latch 474 in response to data set signals TRST and TSET. The data transmission unit 472 is configured to transfer data, stored in the first node QT_N of the latch 474, to the second sense node SO.

The latch 474 includes a first inverter IV474 and a second inverter IV475. The output terminal of the first inverter IV474 is coupled to the input terminal of the second inverter IV475, and the output terminal of the second inverter IV475 is coupled to the input terminal of the first inverter IV474. A node between the output terminal of the first inverter IV474 and the input terminal of the second inverter IV475 is called the first node QT_N. A node between the output terminal of the second inverter IV475 and the input terminal of the first inverter IV474 is called a second node QT. Accordingly, data of opposite levels are stored in the first node QT_N and the second node QT.

The data set unit 476 includes an NMOS transistor N476 and an NMOS transistor N477. The NMOS transistor N476 is configured to supply the first node QT_N with the ground voltage, received from the sense node sense unit 444, in response to the first data set signal TSET. The NMOS transistor N477 is configured to supply the second node QT with the ground voltage, received from the sense node sense unit 444, in response to the second data set signal TRST.

The data transmission unit 472 includes an NMOS transistor N472 and an NMOS transistor N473. The NMOS transistor N472 is configured to transfer data, stored in the first node QT_N of the latch 474, to the second sense node SO in response to a first data transmission signal TRANT. The NMOS transistor N473 is configured to transfer data, stored in the second node QT of the latch 474, to the second sense node SO in response to the second data transmission signal TRANT_N. Accordingly, data stored in the node QT or QT_N of the latch 474 can be transferred to the second sense node SO in response to the data transmission signal TRANT or TRANT_N.

A read method or a verification method using the nonvolatile memory device constructed as above is described below.

Figure 5A:
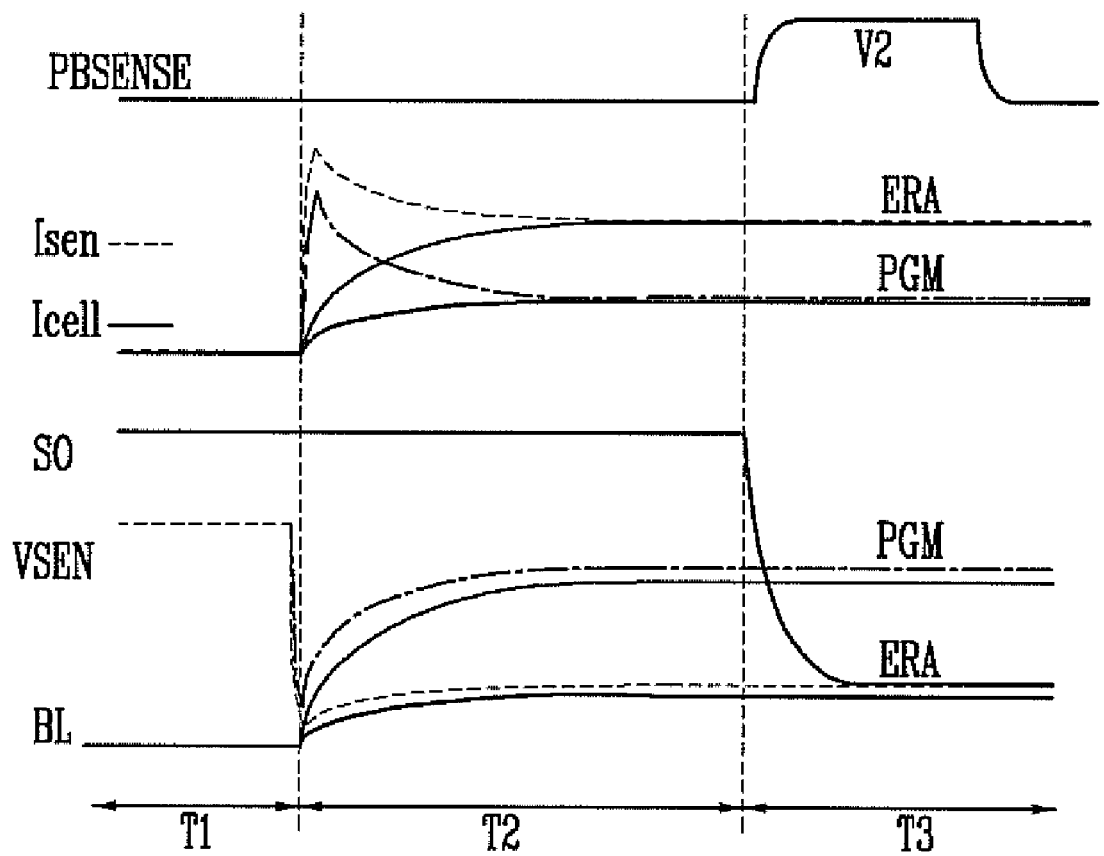
FIGS. 5A and 5B are a waveform and a graph illustrating a read method or a verification method using the nonvolatile memory device according to an embodiment of the present invention.
Figure 5B:
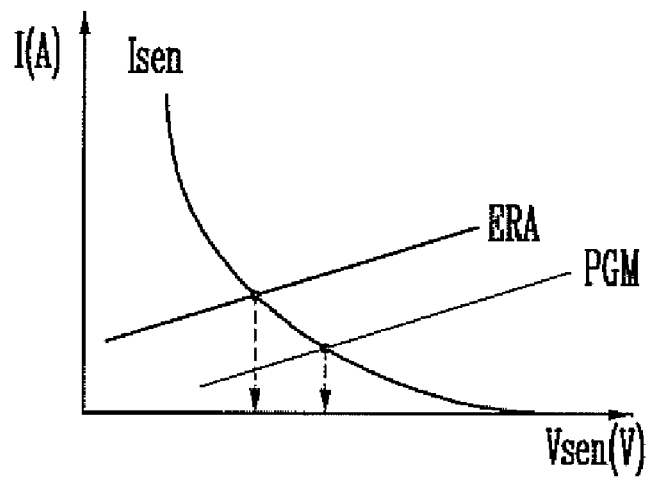

FIGS. 5A and 5B are a waveform and a graph illustrating a read method or a verification method using the nonvolatile memory device according to an embodiment of the present invention.

The read method and the verification method both include determining whether the threshold voltage of a memory cell is larger than a reference voltage, and accordingly, they have substantially the same construction.

(1) Period T1

When an operation first begins, coupling between the current supply unit 410 and the bit line is cut off. Here, the bit line is discharged to a low level by the bit line switch unit 420.

Meanwhile, the enable signal SENSE_EN is supplied to the current supply unit 410 such that the current supply unit 410 can supply current to the bit line. Since coupling between the current supply unit 410 and the bit line has been cut off, the current does not flow. However, a voltage of a high level is supplied to the first sense node VSEN.

Conventionally, in the state in which a bit line is precharged to a high level, the voltage of the bit line is changed depending on whether the threshold voltage of a cell is larger than a reference voltage, and a verification operation is performed according to the degree of a change in the voltage of the bit line. In the present embodiment, however, the verification operation is performed using current supplied by the current supply unit 410 without precharging the bit line.

(2) Period T2

Next, the current supply unit 410, the bit line, and the cell string are coupled together, and so the current Icell flowing through the cell string 430 and voltage of the first sense node VSEN are changed according to the threshold voltage of a target read cell.

The current supply unit 410 and the bit line are coupled together in response to the bit line selection signal SELBL of a high level. Although not shown, the bit line and the cell string 430 are coupled together in response to the drain selection signal DSL, and the common source line CSL and the cell string 430 are coupled together in response to the source selection signal SSL. Next, a reference voltage Vread is supplied to the word line of the target read cell, and a pass voltage Vpass is supplied to the word lines of the remaining cells.

If the target read cell is programmed to have a threshold voltage less than the reference voltage Vread, a current path from the current supply unit 410 to the cell string 430 is formed because the target read cell supplied with the reference voltage is also turned on. Accordingly, the current Icell flowing through the cell string 430 rises.

However, if the target read cell is programmed to have a threshold voltage larger than the reference voltage Vread, a current path from the current supply unit 410 to the cell string 430 is cut off because the target read cell supplied with the reference voltage Vread is turned off. Accordingly, the current Icell flowing through the cell string 430 decreases. That is, the current Icell flowing through the cell string in the case in which the target read cell has been programmed to have a threshold voltage larger than the reference voltage is less than the current Icell flowing through the cell string in the case in which the target read cell has been programmed to have a threshold voltage less than the reference voltage.

Meanwhile, the bit line and the first sense node VSEN have the same voltage because they are coupled together. Further, referring to FIG. 5B, as described above with reference to FIGS. 3A to 3C, the current Icell flowing through the cell string 430 is proportional to the voltage of the first sense node VSEN. Accordingly, if the target read cell is programmed to have a threshold voltage larger than the reference voltage Vread (PGM), the voltage of the first sense node VSEN rises as compared with the case in which the target read cell is programmed to have a threshold voltage less than the reference voltage (ERA).

(3) Period T3

The voltage of the bit line (i.e., voltage of the first sense node VSEN) is sensed, and data are stored in the latch according to a result of the sensing.

Prior to the operation of the period T3, the sense node precharge signal PRECH_N of a low level is supplied to thereby precharge the second sense node SO to a high level. Next, when the operation of the period T3 is performed, the application of the sense node precharge signal PRECH_N is stopped, and so the second sense node SO remains in the floating state of a high level.

Next, the bit line sense signal PBSENSE of a specific level V2 is supplied such that voltage of the second sense node SO is changed according to the voltage of the first sense node VSEN.

The specific level V2 functions to make a target read cell have a threshold voltage, which is equal to or lower than voltage supplied to the first sense node VSEN in the case in which the target read cell is in a program state and to make a target read cell have a threshold voltage, which is larger than voltage supplied to the first sense node VSEN in the case in which the target read cell is in an erase state. Such a function is based on the switching characteristic of an NMOS transistor. Since the second sense node SO is precharged to a high level, the first sense node VSEN functions as the source of an NMOS transistor. Accordingly, the transistor can be turned on only when a difference in the voltage between the gate and the source of the transistor (Vg−VSEN) is larger than the threshold voltage Vt.

That is, in the case in which the bit line sense signal PBSENSE of the specific level V2 is supplied, when the target read cell is in a program state, the NMOS transistor N440 of the bit line sense unit 440 is not turned on according to the voltage of the first sense node VSEN. Accordingly, the voltage of the second sense node SO remains at a high level.

In the case in which the target read cell in an erase state, the NMOS transistor N440 of the bit line sense unit 440 is turned on because the voltage of the first sense node VSEN is at a low level. Accordingly, the second sense node SO is coupled to the first sense node VSEN, and so the voltage of the second sense node SO shifts to a low level. In this case, since the voltage of the second sense node SO is in the floating state, it shifts to a low level according to the voltage of the first sense node VSEN.

That is, when the threshold voltage of the target read cell is larger than the reference voltage (i.e., a program state), the second sense node SO maintains a voltage a high level. However, when the threshold voltage of the target read cell is less than the reference voltage (i.e., an erase state), a voltage of a low level is supplied to the second sense node SO.

As described above, in the present embodiment, a conventional method of precharging the bit line to a high level is not used. In the present embodiment, the verification operation is performed using current supplied by the current supply unit 410 without the bit line precharge operation.

Figure 6:
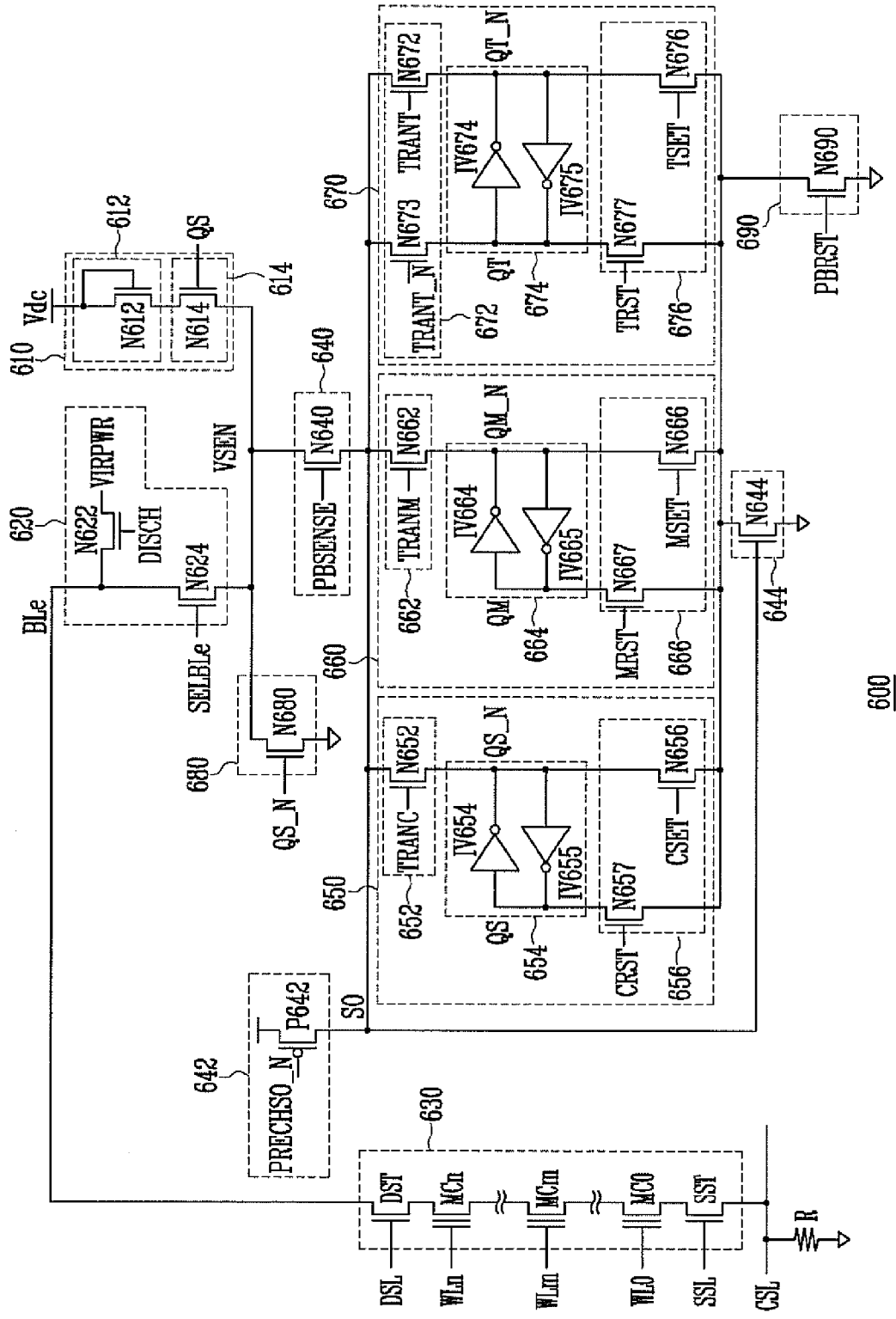
FIG. 6 is a circuit diagram of a nonvolatile memory device according to another embodiment of the present invention.

FIG. 6 is a circuit diagram of a nonvolatile memory device according to another embodiment of the present invention.

The nonvolatile memory device 600 includes a current supply unit 610, a bit line switch unit 620, a cell string 630, a bit line sense unit 640, a sense node precharge unit 642, a sense node sense unit 644, a first latch unit 650, a second latch unit 660, a third latch unit 670, a sense node discharge unit 680, and a ground voltage supply unit 690.

The nonvolatile memory device 600 of the present embodiment has the same construction as the nonvolatile memory device 400 shown in FIG. 4 except for the current supply unit 610, the sense node discharge unit 680, and the ground voltage supply unit 690, and a description of the elements in common with those of FIG. 4 has been omitted for simplicity.

Whether the current transfer unit 614 of the current supply unit 610 will be turned on is determined according to data stored in the second node QS of the first latch unit 650, unlike the embodiment of FIG. 4. A background for such a determination is described below. In the present embodiment, an attempt is made to prevent an under-program phenomenon resulting from source line bouncing. The source line bouncing phenomenon is a phenomenon in which a common source line that must be in a ground state during a verification operation or a read operation has a voltage which is larger than the ground voltage. Resistance components exist between the common source line CSL and the ground. If a high current flows across the cell string, the voltage of the common source line CSL slightly rises because of a voltage supplied to a resistor R. In particular, in the case of a cell string including cells in an erase state, the source line bouncing phenomenon is generated by the cells because the cell string has a high current. In this case, the cells having threshold voltages increased to some extent become problematic. In the case in which, although the threshold voltages of cells have risen to some extent because of a program operation, some of the cells have threshold voltages less than a reference voltage, if the voltage of the common source line rises, the current of the cell string is lowered. Accordingly, there is a possibility that the threshold voltages of the corresponding cells may be read as being larger than the reference voltage when a verification operation is performed. Accordingly, even though the corresponding cells have been programmed to have threshold voltages less than the reference voltage, a determination may be made that they have threshold voltages larger than the reference voltage. Consequently, a subsequent program operation is not performed on the corresponding cells. As described above, cells determined to have been fully programmed, even though they have threshold voltages less than a reference voltage, are called under-programmed cells. In the present embodiment, to minimize such under-programmed cells, current flowing through cells which results in a high cell current is sought to be minimized. Preferably, the current supply unit 610 prevents such a current from being supplied to such program-inhibited cells.

For this purpose, whether the current transfer unit 614 of the current supply unit 610 will be turned on is determined by the second node QS of the first latch unit 650.

For reference, the function of the first latch unit 650 according to the present embodiment slightly differs from that of the first latch unit 450 shown in FIG. 4. The first latch unit 650 stores information about cells having a high cell current when a verification operation is performed after a program operation. When a verification operation is first performed, data '1' are stored in the second node QS irrespective of a program operation such that the current transfer unit 614 of each cell is turned on. If there are cells having a high cell current in a subsequent verification operation, data '0' are stored in the second node QS such that the current transfer unit 614 is blocked. Accordingly, the second latch unit 660 or the third latch unit 670 stores program data and verification data about whether a program operation has been completed.

The sense node discharge unit 680 includes an NMOS transistor N680 turned on according to data stored in the first node QS_N of the first latch unit 650 and configured to transfer a ground voltage to a first sense node VSEN. Accordingly, when data '1' are stored in the first node QS_N, the sense node discharge unit 680 grounds the first sense node VSEN.

The ground voltage supply unit 690 includes an NMOS transistor N690 configured to supply the ground voltage to each of the data set units 656, 666, and 676 of the first, second, and third latch units 650, 660, and 670 in response to a reset signal PBRST. Accordingly, when the reset signal PBRST is received, the NMOS transistor N690 is turned on, and so it transfers the ground voltage to each of the data set units. In the present embodiment, the first node QS_N of the first latch unit 650 is used to store specific data.

The operation of the nonvolatile memory device 600 is described in detail below.

Figure 7:
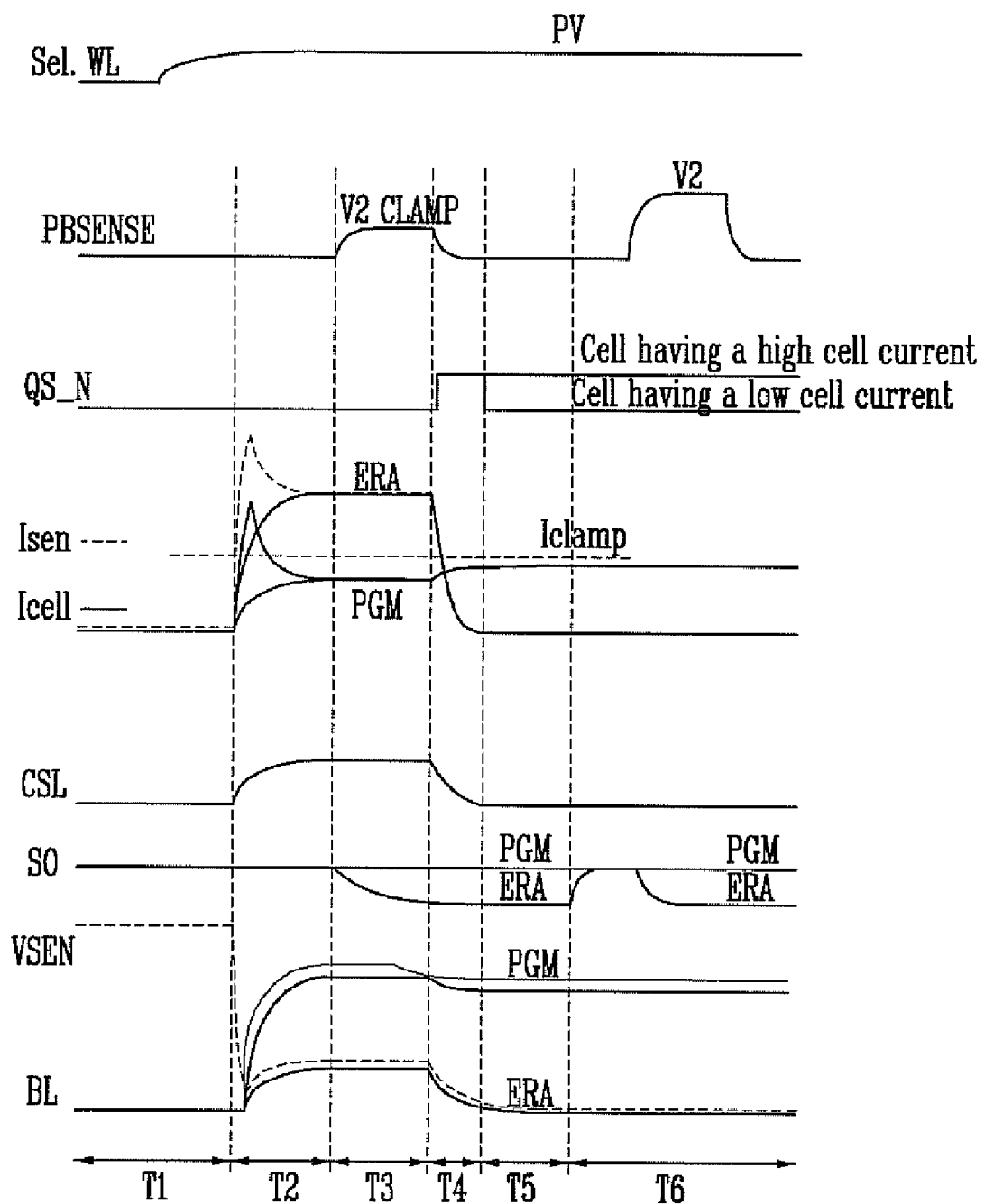
FIG. 7 is a waveform illustrating a verification method using the nonvolatile memory device according to another embodiment of the present invention.

FIG. 7 is a waveform illustrating a verification method using the nonvolatile memory device according to another embodiment of the present invention.

(1) Period T1

When an operation first begins, coupling between the current supply unit 610 and the bit line is cut off. Here, the bit line is discharged to a low level by the bit line switch unit 620.

Meanwhile, data '1' are stored in the second node QS of the first latch unit 650 of a page buffer coupled to cells such that the current transfer unit 614 can supply the current of the current source 612 to the bit line. In this case, since coupling between the current transfer unit 614 and the bit line is cut off, current does not flow. However, only voltage of a high level is supplied to the first sense node VSEN.

A method of storing data '1' in the second node QS is described below.

The reset signal PBRST is supplied to the ground voltage supply unit 690, and so the ground voltage is transferred to the data set unit 656 of the first latch unit 650. When the first data set signal CSET is supplied, data '1' are stored in the second node QS. Accordingly, the current transfer unit 614 of all of the cells is turned on, and the current source 612 can supply current.

Alternatively, the sense node sense unit 644 can be turned on using the sense node precharge unit 642, and data '1' can be stored in the second node QS using the ground voltage transferred by the sense node sense unit 644.

(2) Period T2

Next, the current supply unit 610, the bit line, and the cell string are coupled together such that the current Icell flowing through the cell string and the voltage of the first sense node VSEN are changed according to the threshold voltage of a target read cell. The operation of the period T2 is the same as that of the period T2 described with reference to FIG. 5.

That is, the current Icell flowing through the cell string in the case in which the target read cell has been programmed to have a threshold voltage larger than the reference voltage is less than the current Icell flowing through the cell string in the case in which the target read cell has been programmed to have a threshold voltage less than the reference voltage. Further, the voltage of the first sense node VSEN in the case in which the target read cell has been programmed to have a threshold voltage larger than the reference voltage is larger than the voltage of the first sense node VSEN in the case in which the target read cell has been programmed to have a threshold voltage less than the reference voltage.

(3) Period T3

The voltage of the bit line (i.e., the voltage of the first sense node VSEN) is sensed, and so information about cells having a cell current is stored in the first latch unit 650. The operation of the period T3 is performed prior to a subsequent period T6 in which the voltage of the first sense node VSEN is sensed and data are stored such that, if there are cells having a high cell current, the supply of current by the current supply unit 610 can be cut off.

A method of operation of the present embodiment in period T3 is the same as that of the period T3 shown in FIG. 5. A difference between the periods T3 of FIGS. 5 and 7 is that the bit line sense signal PBSENSE supplied in order to sense the voltage of the first sense node VSEN is slightly different. In other words, the bit line sense signal PBSENSE of a first voltage V2 CLAMP is supplied in order to decrease the reference voltage PV supplied to a word line or increase a reference current Iclamp.

That is, in the case in which the bit line sense signal PBSENSE of a second voltage V2 is supplied as in the subsequent period T6, assuming that whether the threshold voltage of a cell is larger than the reference voltage PV can be determined, when the bit line sense signal of the first voltage V2CLAMP less than the second voltage V2 is supplied, the threshold voltage of the cell can be sensed using a lower reference voltage PV'. Alternatively, the threshold voltage of the cell can be sensed based on the reference current Iclamp larger than an original reference current.

Accordingly, a current flowing through cells having threshold voltages larger than the lowered reference voltage PV' is relatively decreased, and a current flowing through cells having threshold voltages less than the lowered reference voltage PV' is relatively increased. Furthermore, the voltage of a bit line coupled to cells having threshold voltages larger than the decreased reference voltage PV' is relatively increased, and the voltage of a bit line coupled to cells having threshold voltages less than the decreased reference voltage PV' is relatively lowered.

The current flowing through program-inhibited cells or cells programmed not to have threshold voltages larger than a reference voltage, even though they are target program cells, should be larger than the reference current Iclamp. In the present embodiment, the supply of current to those cells is cut off such that a source line bouncing phenomenon is not generated in a subsequent sense operation using a second voltage V2. To this end, an operation of storing information about cells having a cell current larger than the reference current in the first latch unit is described in the following periods.

(4) Period T4

First, data '1' are stored in all of the first nodes QS_N of the first latch units. This operation is performed in such a manner that the ground voltage is transferred to the data set unit 656 by supplying the reset signal PBRST to the ground voltage supply unit 690 and the second data set signal CRST is supplied.

(5) Period T5

Information about a cell current is stored in the first latch unit 650 according to a voltage level of the second sense node SO. In the previous period, data '1' have been stored in all of the first nodes QS_N of the cells.

In the case of cells having a cell current larger than the reference current, the voltage level of the second sense node SO is at a low level. Accordingly, data stored in the first node QS_N remain intact because the sense node sense unit 644 is not driven.

In the case of cells having a cell current less than the reference current, the voltage level of the second sense node SO is at a high level, and so the sense node sense unit 644 is driven. In this case, the first data set signal CSET is supplied such that data '0' are stored in the first node QS_N.

Thus, the sense node discharge unit 680 is driven. That is, in the case of cells having data '1' stored in the first node QS_N, the voltage level of the first sense node SO shifts to a low level.

(6) Period T6

A real verification operation is performed by performing the operations of specific periods, such as the periods T2 and T3 of FIG. 3. In the case of cells having data '1' stored in the first node QS_N (i.e., cells having data '0' stored in the second node QS), the current transfer unit 614 is not operated. That is, current through the current supply unit 610 is not supplied to cells which have data '1' stored in the first node QS_N in the previous period T6 because of a high cell current.

In summary, prior to a verification operation using the reference voltage PV, a verification operation using a voltage PV' less than the reference voltage PV is performed. In this case, in the verification operation, information about cells having a high cell current is stored in the first latch unit.

Accordingly, in a subsequent verification operation using the reference voltage PV, the supply of current to the corresponding cells is cut off.

Figure 8:
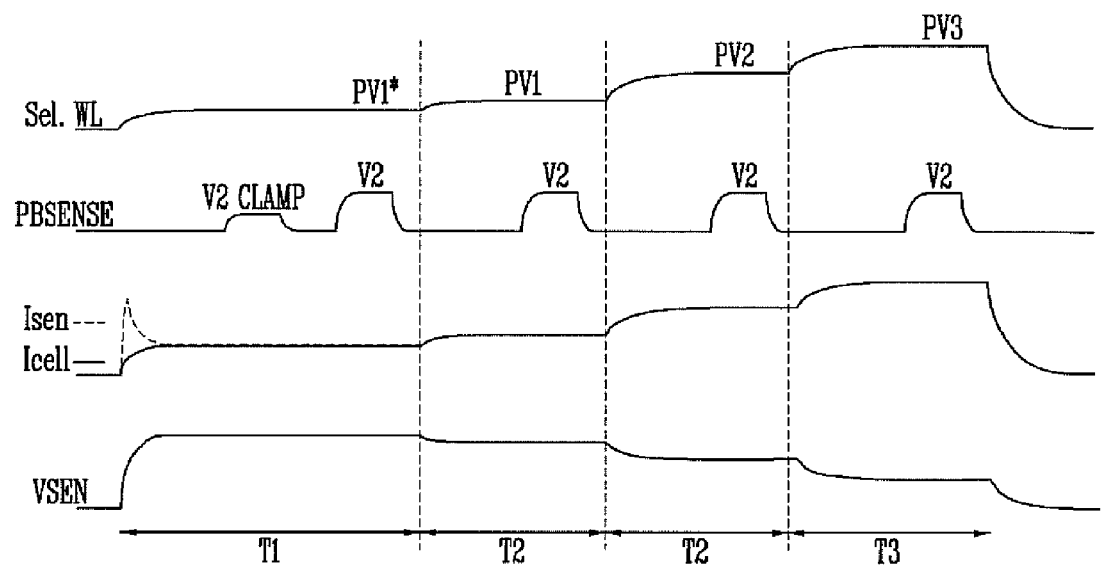
FIG. 8 is a waveform illustrating a fast verification method using the nonvolatile memory device according to an embodiment of the present invention.
Figure 9:
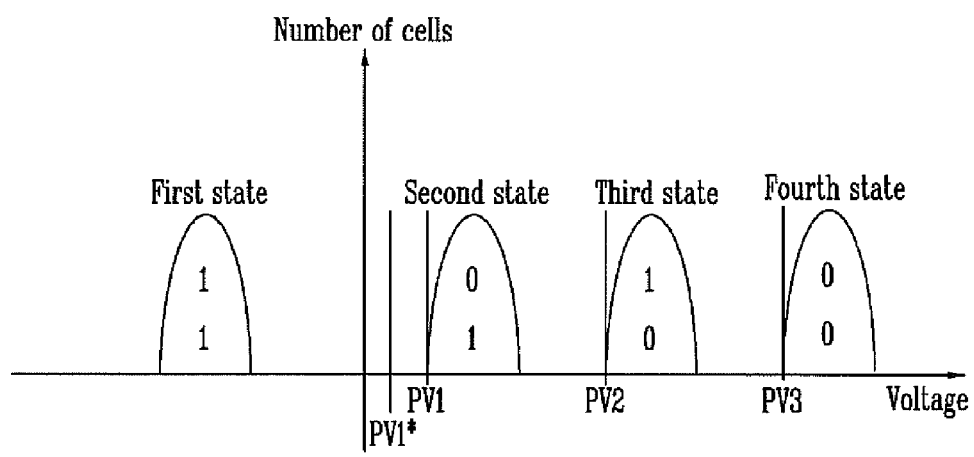
FIG. 9 is a diagram illustrating an MLC program method using the nonvolatile memory device.

FIG. 8 is a waveform illustrating a fast verification method using the nonvolatile memory device according to the present embodiment, and FIG. 9 is a diagram illustrating an MLC program method using the nonvolatile memory device.

First, in the fast verification method of FIG. 8, verification operations are consecutively performed on the basis of a first preliminary voltage PV1* and first to third reference voltages PV1, PV2, and PV3. In typical cases, an operation of precharging a bit line to a high level is performed once, and verification operations using the respective reference voltages are consecutively performed. Accordingly, the verification operations can be performed more quickly than a method in which a bit line is precharged every time. However, the bit line cannot remain at a high level until the verification operation using the third reference voltage has occurred because of the leakage current occurring in the bit line. Accordingly, there is a possibility that a cell may be read as having a state different from an actual state.

In a construction in which a bit line is not precharged as in the present embodiment, a fast verification operation for consecutively performing verification operations can be performed without special problems.

First, as described above with reference to FIG. 7, the verification operation using the first preliminary voltage PV1* is performed (period T1). Here, the first preliminary voltage PV1* is voltage for a double verification operation. That is, with consideration taken of the program speed of each cell, the verification operation using the first preliminary voltage PV1* is performed in order to reduce the amount of a shift in the threshold voltages of cells resulting from a program operation, which are first programmed with more than the first preliminary voltage PV1*, as compared with other cells.

Next, the verification operation using the first reference voltage PV1, the verification operation using the second reference voltage PV2, and the verification operation using the third reference voltage PV3 are consecutively performed. In the present embodiment, a conventional problem resulting from the leakage current occurring in a bit line can be solved because whether a cell has been programmed is sensed using current supplied by the current supply unit 410.

The present embodiment can be applied to an even/odd simultaneous program method because the coupling between bit lines does not influence the sensing accuracy. Furthermore, a source line bouncing phenomenon can be minimized because the current supply unit is selectively driven according to the state of a cell. In addition, since an operation of precharging a bit line is not performed, the performance of a fast verification method can be further improved.

What is claimed is:

1. A nonvolatile memory device, comprising:
a memory cell string coupled to a bit line;
a bit line switch unit configured to selectively couple the bit line of the memory cell string to a second sense node;
a current supply unit configured to supply a current to the second sense node so as to supply the current to the memory cell string through the bit line switch unit while a reference voltage and a pass voltage are supplied to memory cells of the memory cell string;
a sense node precharge unit configured to precharge a first sense node after the current supply unit supplies the current to the second sense node;
a bit line sense unit configured to selectively couple the second sense node to the first sense node after the sense node precharge unit precharges the first sense node; and
a plurality of data latches configured to latch data based on a voltage of the first sense node.

2. The nonvolatile memory device of claim 1, wherein the current supply unit comprises:
a current source for supplying the current; and
a current transfer unit configured to supply the first sense node with the current of the current source in response to a control signal.

3. The nonvolatile memory device of claim 1, wherein the bit line switch unit comprises an NMOS transistor configured to couple the memory cell string to the current supply unit in response to a bit line selection signal.

4. The nonvolatile memory device of claim 3, wherein the bit line switch unit further comprises:
a variable voltage input terminal configured to supply a variable voltage; and
an NMOS transistor configured to couple the variable voltage input terminal to the bit line of the memory cell string in response to a discharge signal.

5. A nonvolatile memory device, comprising:
a memory cell string coupled to a bit line;
a bit line switch unit configured to selectively couple the bit line of the memory cell string to a second sense node;
a current supply unit configured to supply a current to the second sense node so as to supply the current to the memory cell string through the bit line switch unit while a reference voltage and a pass voltage are supplied to memory cells of the memory cell string;
a sense node precharge unit configured to precharge a first sense node after the current supply unit supplies the current to the second sense node;
a bit line sense unit configured to selectively couple the second sense node to the first sense node after the sense node precharge unit precharges the first sense node; and
a data latch unit configured to latch data based on a voltage of the first sense node;
wherein a current supply of the current supply unit is responsive to the data stored in the data latch unit.

6. The nonvolatile memory device of claim 5, further comprising a sense node discharge unit configured to transfer a ground voltage to the first sense node according to the data stored in the data latch unit.

7. The nonvolatile memory device of claim 5, further comprising a ground voltage supply unit configured to supply a ground voltage to the data latch unit in response to a reset signal.

8. The nonvolatile memory device of claim 5, wherein the current supply unit comprises:
a current source for supplying the current; and
a current transfer unit configured to supply the current from the current source to the first sense node according to the data stored in the data latch unit.

* * * * *